United States Patent [19]

Bruning et al.

[11] Patent Number: 4,790,642
[45] Date of Patent: Dec. 13, 1988

[54] INTEGRATED METROLOGY FOR MICROLITHOGRAPHIC OBJECTIVE REDUCING LENS

[75] Inventors: John H. Bruning, Pittsford; Graham J. Siddell, Rochester, both of N.Y.

[73] Assignee: GCA Corporation/Tropel Division, Fairport, N.Y.

[21] Appl. No.: 936,245

[22] Filed: Dec. 1, 1986

[51] Int. Cl.⁴ .......... G02B 7/02; G02B 21/24; G01B 11/02; G01R 27/26
[52] U.S. Cl. ................. 350/574; 350/521; 324/61 R; 356/358; 356/401
[58] Field of Search .......... 324/61 R, 158 F; 350/518, 521, 574; 356/358, 399, 401

[56] References Cited

U.S. PATENT DOCUMENTS

| | | | |
|---|---|---|---|
| 3,577,791 | 5/1971 | Broek | 350/633 |
| 3,825,323 | 7/1974 | Landwer | 324/61 R |
| 3,953,133 | 4/1976 | Jacoby | 356/363 |
| 4,027,976 | 6/1977 | Amon | 356/358 |
| 4,139,304 | 2/1979 | Redman et al. | 356/358 |
| 4,311,390 | 1/1982 | Phillips | 356/363 |
| 4,328,553 | 5/1982 | Fredriksen et al. | |
| 4,362,385 | 12/1982 | Lobach | 356/401 |
| 4,385,838 | 5/1983 | Nakazawa et al. | |
| 4,398,824 | 8/1983 | Feldman et al. | 356/401 |
| 4,539,835 | 9/1985 | Shambroom et al. | |
| 4,573,791 | 3/1986 | Phillips | 356/401 |
| 4,580,900 | 4/1986 | Larsen | 356/400 |
| 4,615,621 | 10/1986 | Allen et al. | 356/399 |
| 4,638,486 | 1/1987 | Dost et al. | 350/633 |
| 4,654,581 | 3/1987 | Neukermans et al. | 324/61 R |
| 4,686,531 | 8/1987 | Shambroom et al. | 324/61 R |

FOREIGN PATENT DOCUMENTS 189869 8/1986 European Pat. Off. ......... 356/401

Primary Examiner—John K. Corbin
Assistant Examiner—Ronald M. Kachmarik
Attorney, Agent, or Firm—Stonebraker, Shepard & Stephens

[57] ABSTRACT

Metrology for a microlithographic objective reducing lens 10 is integrated into a metrology block 20 secured to a lower region of the barrel 15 for lens 10. Block 20 has a central opening 27 around a lowermost element 11 of lens 10; and block 20 mounts distance detectors 28 around central opening 27, a pair of microscope objectives 30 and 31, and a pair of X and Y mirrors 40 and 41.

36 Claims, 4 Drawing Sheets

INTEGRATED METROLOGY FOR MICROLITHOGRAPHIC OBJECTIVE REDUCING LENS

BACKGROUND

Microlithographic objective reducing lenses are used for reducing and imaging patterns for electronic microcircuits on semi-conductor wafers. The microlithography industry seeks ever-greater accuracy in the registration and imaging to facilitate miniaturizing the circuitry and to preserve accuracy and reliability in the final product. Hence, any substantial increase in accuracy for microlithographic objective reducing lenses is a welcome advance in this art.

Metrology for microlithographic objective reducing lenses is necessary for referencing the wafer relative to the lens to ensure that the desired interrelationship between the lens and the wafer is maintained as accurately as possible. Six degrees of freedom of relative motion are possible and include X and Y registration in the plane of the wafer surface, Z axis distance between the lens and the wafer, tip and tilt angles between the lens and wafer, and the rotational angle of the wafer around the Z axis of the lens. Computers are programmed to control the movements involved, and detectors or sensors for gathering information on the position of the wafer relative to the lens are included within the metrology components. These have previously been mounted on a frame or housing surrounding the barrel of the lens, and they have included such elements as microscope objectives for registering with location marks on the wafer surface, mirrors for reflecting the beams of fringe-counting interferometers, and a grazing incidence interferometer for detecting the Z axis distance between the wafer surface and the lens.

We have discovered a better and more accurate way of integrating the metrology components with a microlithographic objective reducing lens. Our metrology arrangement improves the attainable stability and accuracy, which we accomplish partly by integrating the metrology components with the barrel of the lens to eliminate instabilities caused by the previous metrology frames or housings around the lens barrels. We have also selected and arranged the metrology components that we integrate into the lens barrel to minimize distances between the lens and its metrology components and to ensure that everything cooperates for enhancing accuracy.

SUMMARY OF THE INVENTION

Our metrology for a microlithographic objective reducing lens is integrated into a block secured to a lower region of the barrel for the lens. The block has a central opening around a lowermost element of the lens, and the block is otherwise securely mounted on the lens barrel to ensure an accurate relation between the block and the lowermost lens element. The metrology components integrated into the block include distance detectors arranged on the block to face downward around the central opening, a pair of microscope objectives mounted on the block outside the central opening, and a pair of X and Y mirrors also mounted on the block. All these components are then spaced only a short distance from the lowermost lens element in positions that are stabilized by the block to improve the accuracy of the metrology system based on these components.

DRAWINGS

DETAILED DESCRIPTION

Figure 1:
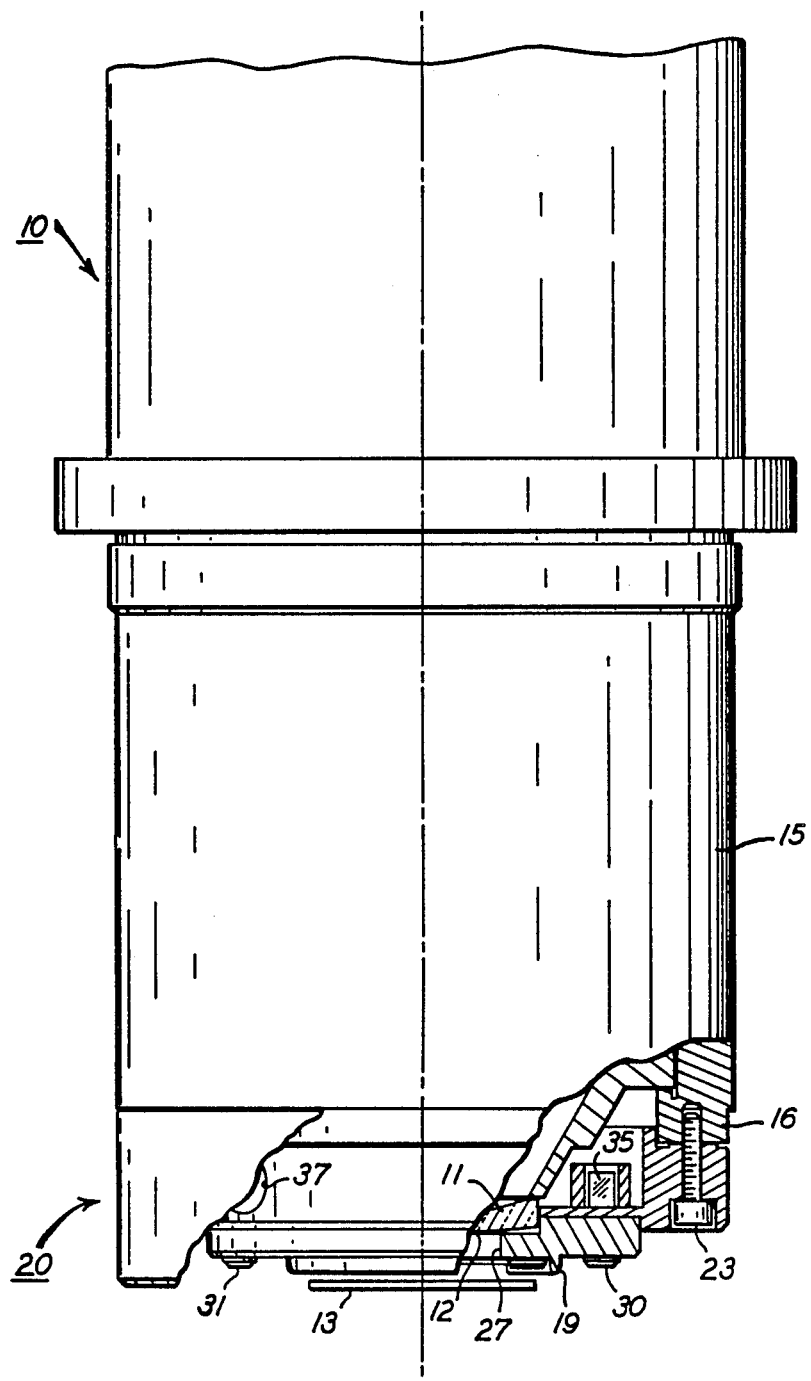
FIG. 1 is a partially cross-sectioned, and partially schematic elevational view of a lower region of a microlithographic objective reducing lens having metrology components integrated with the lens barrel according to our invention.
Figure 2:
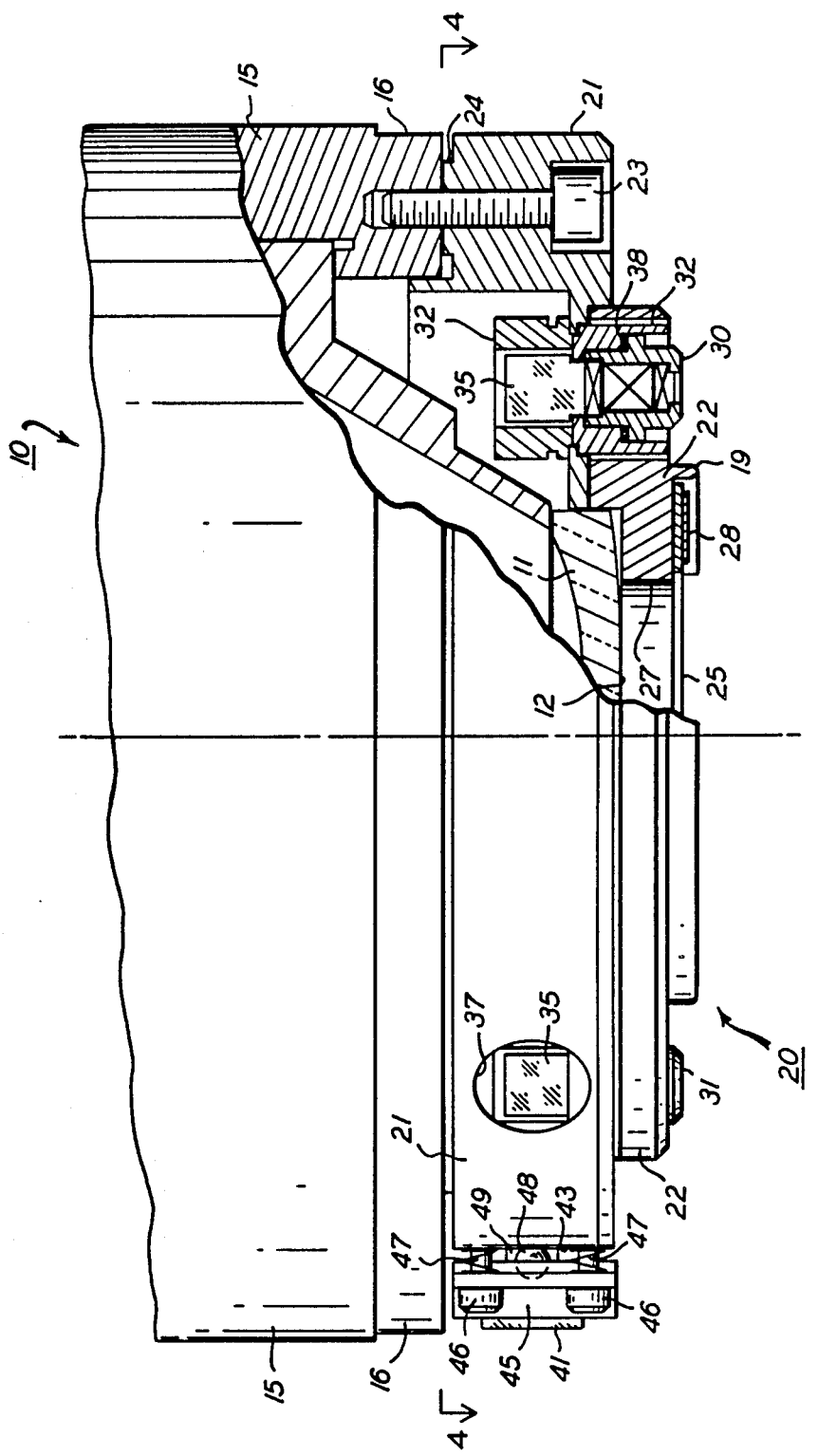
FIG. 2 is an enlarged and partially sectioned, side elevational view of the metrology block at the lower end of the lens shown in FIG. 1.
Figure 3:
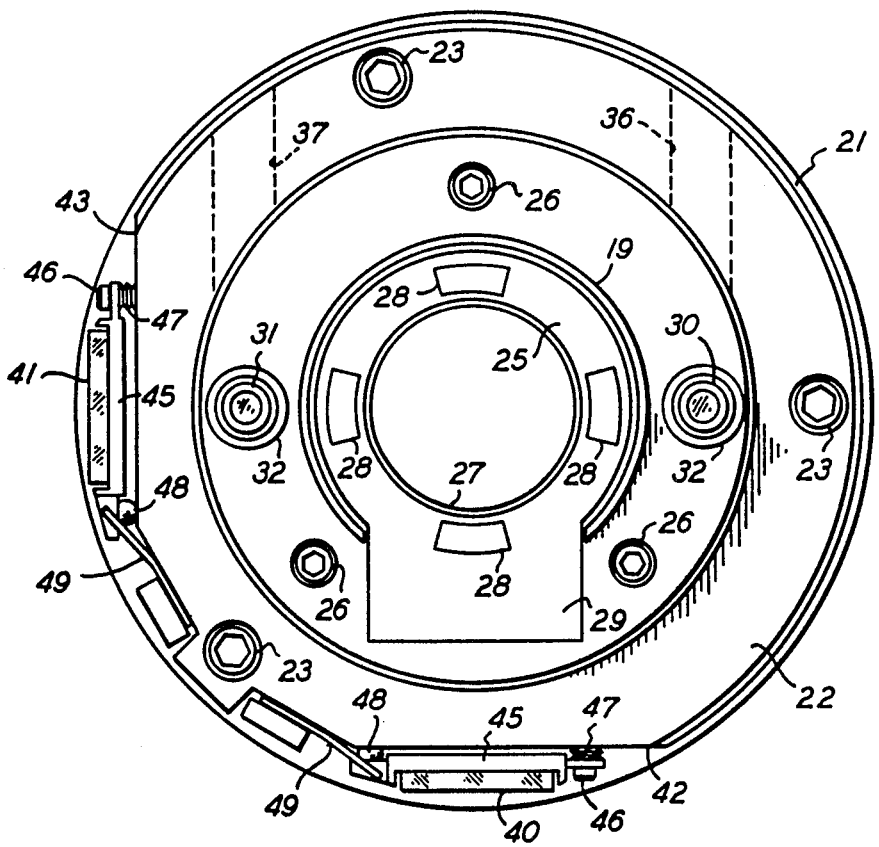
FIG. 3 is a bottom view of the metrology block of FIG. 2.
Figure 4:
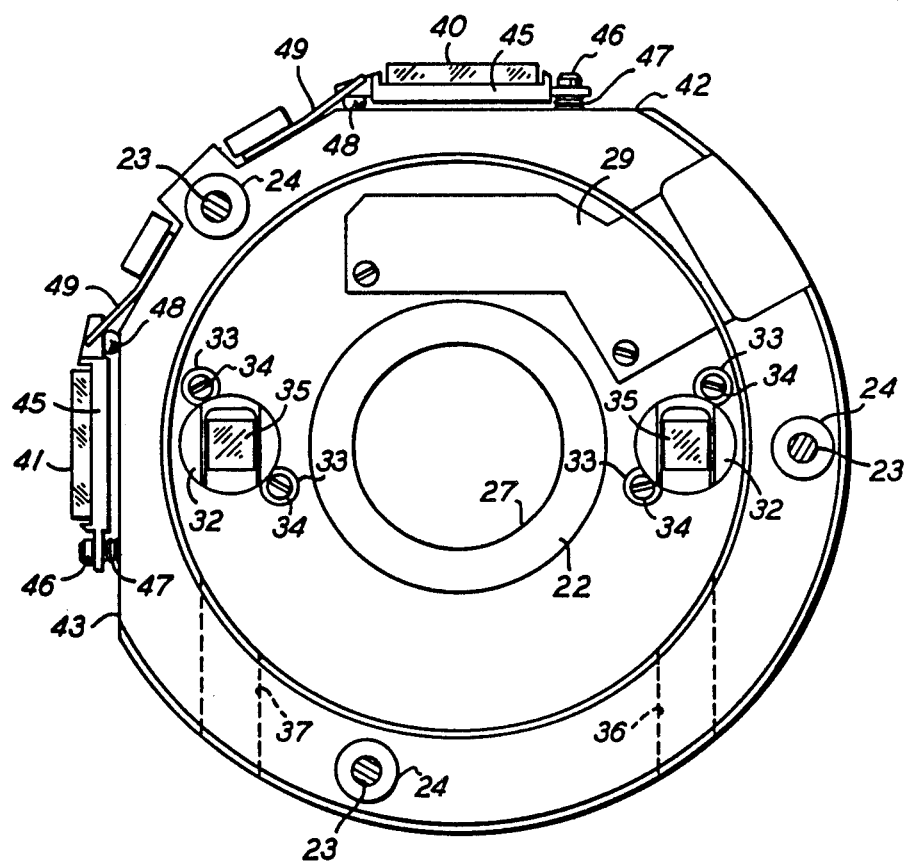
FIG. 4 is a plan view of the metrology block of FIG. 2, separated from the lower region of the lens barrel.

Microlithographic objective reducing lens 10 is shown partially cut away and emptied of all but the lowermost element 11 of its many lens elements, which are carefully assembled with the highest possible accuracy into generally cylindrical lens barrel 15. Some parts have been eliminated for simplicity, and the controlled environment in which lens 10 operates is also not illustrated.

The metrology used to control the positional interrelationships, between wafer 13 and lens 10 enjoys better accuracy, we find, when it is closely and accurately associated with lowermost surface 12 of lens element 11.

To accomplish this, we have devised metrology block 20 to contain and mount metrology components and to fasten directly and securely to a lower region of lens barrel 15. The metrology components that we prefer include a capacitive distance detector 25 having four elements 28, a pair of microscope objectives 30 and 31, and X and Y reference mirrors 40 and 41. We prefer that all these metrology components be mounted directly on metrology block 20, as explained more fully below, so that they are all within the outside diameter of lens barrel 15 where they are closely and accurately associated with lowermost element surface 12. Although we prefer capacitive distance detector 25 for metrology block 20, alternative distance detectors such as pneumatic gauging or optical transducers could also be used for measurements in the Z axis direction. Also, it is desirable, but not required, that metrology components on block 20 be mounted within the outside diameter of lens barrel 15.

We prefer forming metrology block 20 in two main parts that include a generally circular ring 21 fastened to a lower region of lens barrel 15 and an annular sensor plate 22 fastened to ring 21. Three screws 23 secure ring 21 to lens barrel 15, and ring 21 has small locator feet 24 surrounding each of the screws 23 for accurately locating the plane of ring 21 relative to lens barrel 15. Three screws 26 fasten sensor plate 22 to ring 21 and locate the plane of plate 22 relative to ring 21 in a similar way. Ring 21 and plate 22 can also be machined as a single unit.

We also prefer that metrology block 20 be formed of a dimensionally stable material, such as a ceramic or an Invar alloy of nickel and iron. The material of block 20 should be dimensionally stable within one millionth of an inch during an indefinite lifetime in a controlled environment. Dimensional stability to maintain the positional relationships of the metrology components to lowermost lens element 11 is more important than any specific shape or dimensions.

Plate 22 has a central opening 27 around lowermost element surface 12, and capacitive distance detector 25, with its elements 28, is preferably arranged on a downward facing surface of plate 22 around central opening 27 and within guard ring 19. This disposes distance detector 25 in as close a relationship as possible with lowermost element surface 12 for measuring the distance to the upper surface of wafer 13. Since room is available, some of the electronics 29 for capacitive distance detector 25 are mounted on sensor plate 22 as schematically shown.

Microscope objectives 30 and 31 are threaded into mounts 32 that are arranged in holes in sensor plate 22. Each mount 32 is held in place by collars 33 on screws 34 so that objectives 30 and 31, and their beam-reflecting prisms 35, are rotatable relative to plate 22 for alignment purposes. Objectives 31 and 32 are also vertically adjustable relative to plate 22 by means of shims or spacers 38. Bore holes 36 and 37 through ring 21 afford passageways through which beams from the microscope objectives are transmitted outward. We direct these beams to video cameras, either through a conventional optical transmission path outside of lens barrel 15 or via fiber optic cables. Microscope objectives 30 and 31 are preferably arranged within the inside diameter of lens barrel 15 and outside of central opening 27. We prefer using two microscope objectives spaced diametrically on opposite sides of capacitive distance detector 25, but microscope objectives can also be arranged elsewhere. In our positioning of objectives 30 and 31, they are spaced only an inch and a half from the lens axis and only three inches apart. This improves on the stability attainable with microscope objectives positioned outside of lens barrel 15 at a greater distance from the lens axis.

We prefer mounting X and Y mirrors 40 and 41 on respective flat surfaces 42 and 43 formed on ring 21 perpendicular to each other. Each mirror 40 and 41 mounts on a three-point stand 45, two points of which are adjustment screws 46 surrounded by spring washers 47 and threaded into ring 21. The other point for each stand 45 is a ball bearing 48 held between ring 21 and stand 45 by a spring clip 49. Reference mirrors 40 and 41 can be accurately aligned relative to the beams of fringe-counting interferometers by adjusting screws 46.

The preferred metrology components, as arranged in metrology block 20, provide information for all six degrees of freedom of relative motion between lens 10 and wafer 13. Microscope objectives 30 and 31 can be registered with location marks made on an upper surface of wafer 13, and we prefer registering one microscope objective with its respective location mark and then rotating the wafer relative to the lens to register the other mark with the other microscope objective. This establishes an X, Y reference that is also correct for rotational angle. The microscope objectives preferably have a field of view larger than the location marks to facilitate this registration, which is preferably made visible on a video monitor. From the reference position, the wafer is movable under the lens in the X and Y directions under control of fringe-counting interferometers that use mirrors 40 and 41 as reference mirrors and use similar mirrors (not shown) on the wafer-moving stage as test mirrors. By this means, each increment of motion of wafer 13 relative to lens 10 is measured in both X and Y directions.

Capacitive distance detector 25 is highly accurate in measuring the distance to the upper surface of wafer 13. Since distance detector 25 has at least three and preferably four elements 28, these can detect tip and tilt angles between lens 10 and the top surface of wafer 13. It is even possible for our metrology to scan and map the topography of the top surface of wafer 13 before imaging the wafer so as to make adjustments based on knowledge of the topography during the imaging process. We prefer that the plane of distance detector 25 be within about one-half a millimeter of wafer 13 for a working range at which a capacitive distance detector is highly accurate. Other distances may apply for distance detectors operating pneumatically or with optical transducers.

The close association of distance detector 25 with lowermost element surface 12 assures that distance and tip and tilt angle measurements are made more accurately than with existing methods. The positioning of microscope objectives 30 and 31 close to element 11, and preferably within the inside diameter of lens barrel 15, improves their stability and long-term accuracy relative to prior art locations spaced outside of lens barrel 15. Locating reference mirrors 40 and 41 directly on the machined rim of metrology block 20, and preferably within the outside diameter of lens barrel 15, also assures a simple, direct, and highly accurate relationship between these mirrors and lens element 11. The dimensionally stable support that metrology block 20 gives to all these components helps maintain the accuracy they can attain.

By virtue of these measures, our metrology arrangement substantially improves the accuracy of the positioning of our microlithographic objective reducing lens relative to the wafer, compared to the previously attainable accuracy. Our accuracy improvement is by an order of magnitude; and at the same time, our metrology arrangement is simpler and less expensive than prior art metrology systems arranged outside of lens barrel 15.

We claim:

1. Metrology apparatus integrated with a microlithographic objective reducing lens, said metrology apparatus comprising:
   a. a block secured under a lower region of a barrel for said lens, said block having a central opening within said lens barrel, said central opening extending around a lowermost element of said lens, and said block extending between said central opening and said lens barrel;
   b. a pair of microscope objectives mounted on said block between said central opening and said lens barrel; and
   c. a pair of X and Y interferometer mirrors mounted on said block under said lens barrel.

2. The metrology apparatus of claim 1 including distance detectors arranged on said block between said central opening and said lens barrel to face downward around said central opening.

3. The metrology apparatus of claim 1 wherein said block has bored passageways for transmitting beams from said microscope objectives.

4. The metrology apparatus of claim 2 wherein said distance detectors include at least three capacitive distance detectors.

5. The metrology apparatus of claim 1 wherein a pair of mounts respectively secure each of said microscope objectives on said block to permit said microscope objectives to be adjusted rotationally and vertically relative to said block.

6. The metrology apparatus of claim 1 including a three-point stand for mounting each of said mirrors on a respective flat surface of said block, two points of each of said stands being adjustable.

7. A metrology block for a microlithographic objective reducing lens, said metrology block comprising:
   a. said block being formed of a dimensionally stable material and being secured to a barrel for said lens under a lower region of said barrel;
   b. said block having a central opening within said lens barrel, said central opening extending around a lowermost element for said lens;
   c. metrology components for said lens being mounted on said block; and
   d. said metrology components including a pair of X and Y interferometer mirrors arranged under said lens barrel within an outside diameter of said lens barrel.

8. The metrology block of claim 7 wherein said block has a pair of flat surfaces perpendicular to each other for mounting said X and Y mirrors, a pair of three-point stands mount said mirrors respectively on said flat surfaces, and two points of each of said stands are adjustable.

9. The metrology block of claim 7 wherein said metrology components include a pair of microscope objectives arranged between said central opening and said lens barrel.

10. The metrology block of claim 9 wherein a pair of mounts respectively secure each of said microscope objectives on said block to permit said microscope objectives to be adjusted rotationally and vertically relative to said block.

11. The metrology block of claim 9 including passageways in said block for transmitting beams from said microscope objectives to a region outside said lens barrel.

12. The metrology block of claim 7 wherein said metrology components include at least three distance detectors arranged on said block to face downward around said central opening.

13. The metrology block of claim 12 wherein said metrology components include a pair of microscope objectives arranged between said central opening and said lens barrel.

14. The metrology block of claim 13 wherein said distance detectors are capacitive.

15. The metrology block of claim 14 wherein a pair of mounts respectively secure each of said microscope objectives on said block to permit said microscope objectives to be adjusted rotationally and vertically relative to said block.

16. A metrology system coupled to a microlithographic objective reducing lens, said metrology system comprising:
   a. a block of dimensionally stable material mounted underneath a bottom of a barrel for said lens to extend around a lowermost element of said lens;
   b. said block having a central opening inside of said lens barrel and said lowermost lens element being disposed within said central opening;
   c. a pair of microscope objectives mounted on said block within an inside diameter of said barrel for said lens and outside of said central opening of said block; and
   d. a pair of mounts for respectively mounting each of said microscope objectives on said block, said mounts permitting said microscope objectives to be adjusted rotationally and vertically relative to said block.

17. The metrology system of claim 16 including at least three distance detectors mounted on an under surface of said block to face downward around said lowermost element of said lens.

18. The metrology system of claim 17 wherein said distance detectors are capacitive.

19. The metrology system of claim 18 including a pair of X and Y interferometer mirrors mounted on said block within an outside diameter of said lens barrel.

20. The metrology system of claim 18 including passageways in said block for transmitting beams from said microscope objectives.

21. The metrology system of claim 16 including a pair of X and Y interferometer mirrors mounted on said block within an outside diameter of said lens barrel.

22. The metrology system of claim 21 including at least three distance detectors mounted on an under surface of said block to face downward around said lowermost element of said lens.

23. The metrology system of claim 21 including passageways in said block for transmitting beams from said microscope objectives.

24. The metrology system of claim 21 including three-point stands for adjusting each of said mirrors.

25. Metrology apparatus integrated with a microlithographic objective reducing lens, said metrology apparatus comprising:
   a. a block of dimensionally stable material connected under a lower region of a barrel for said lens, said block having a central opening around a lowermost element of said lens, and said block extending within said lens barrel between said lens barrel and said central opening; and
   b. metrology components mounted on said block, said metrology components including a microscope objective arranged outside said central opening and within an inside diameter of said lens barrel.

26. The metrology apparatus of claim 25 wherein said metrology components include a pair of microscope objectives arranged between said central opening and said lens barrel.

27. The metrology apparatus of claim 26 including a pair of mounts for said microscope objectives, said mounts permitting said microscope objectives to be adjusted rotationally and vertically relative to said block.

28. The metrology apparatus of claim 25 wherein said metrology components include a pair of X and Y interferometer mirrors mounted on said block.

29. The metrology apparatus of claim 28 including a pair of three-point stands for mounting said mirrors on said block.

30. The metrology apparatus of claim 25 wherein said metrology components include at least three distance detectors arranged on a downward facing surface of said block around said central opening.

31. The metrology apparatus of claim 30 wherein said distance detectors are capacitive.

32. The metrology apparatus of claim 25 wherein said metrology components include a pair of X and Y interferometer mirrors mounted on said block and a pair of microscope objectives arranged between said central opening and said lens barrel.

33. The metrology apparatus of claim 32 including a pair of three-point stands for mounting said mirrors on said block.

34. The metrology apparatus of claim 32 including a pair of mounts for said microscope objectives, said mounts permitting said microscope objectives to be adjusted rotationally and vertically relative to said block.

35. The metrology apparatus of claim 34 wherein said metrology components include a distance detector facing downward from an under surface of said block.

36. The metrology apparatus of claim 35 including a pair of three-point stands for mounting said mirrors on said block.

* * * * *